United States Patent
Rosenthal et al.

(10) Patent No.: US 10,259,467 B2
(45) Date of Patent: Apr. 16, 2019

(54) DRIVER SIMULATION SYSTEM AND METHODS OF PERFORMING THE SAME

(71) Applicants: Theodore J. Rosenthal, Redondo Beach, CA (US); David Pegan, Manhattan Beach, CA (US); Peijie Yang, Fremont, CA (US)

(72) Inventors: Theodore J. Rosenthal, Redondo Beach, CA (US); David Pegan, Manhattan Beach, CA (US); Peijie Yang, Fremont, CA (US)

(73) Assignee: Systems Technology, Inc., Hawthorne, CA (US)

( * ) Notice: Subject to any disclaimer, the term of this patent is extended or adjusted under 35 U.S.C. 154(b) by 340 days.

(21) Appl. No.: 15/181,589

(22) Filed: Jun. 14, 2016

(65) Prior Publication Data
US 2016/0368506 A1 Dec. 22, 2016

Related U.S. Application Data

(60) Provisional application No. 62/180,703, filed on Jun. 17, 2015.

(51) Int. Cl.
*G06F 7/48* (2006.01)
*B60W 40/09* (2012.01)
*G06F 17/50* (2006.01)

(52) U.S. Cl.
CPC ......... *B60W 40/09* (2013.01); *G06F 17/5009* (2013.01); *B60W 2510/10* (2013.01); *B60W 2510/18* (2013.01); *B60W 2510/20* (2013.01)

(58) Field of Classification Search
CPC .................................................. B60W 40/09
USPC .............................................................. 703/8
See application file for complete search history.

(56) References Cited

U.S. PATENT DOCUMENTS

| 8,694,328 | B1 | 4/2014 | Gormley |
| 8,738,523 | B1 | 5/2014 | Sanchez |
| 8,930,227 | B2 | 1/2015 | Nepomuceno |
| 2008/0064014 | A1 | 3/2008 | Wojtczak |
| 2009/0220929 | A1 | 9/2009 | Daniel |
| 2013/0316311 | A1 | 11/2013 | England |
| 2014/0220513 | A1 | 8/2014 | Harkness |

FOREIGN PATENT DOCUMENTS

| CN | 104464438 | 3/2015 |
| WO | 2005036301 | 5/2005 |

OTHER PUBLICATIONS

TESIS simulation software available at http://www.tesis-dynaware.com/en/products/vedyna-entry/overview.html, 2013.

*Primary Examiner* — Timothy A Mudrick
(74) *Attorney, Agent, or Firm* — Vedder Price P.C.

(57) ABSTRACT

A method of simulating manipulating a vehicle, the method including the steps of transmitting a simulation to a plurality of remote devices, gathering information pertaining to a response of each user to the simulation on each remote device, comparing each response of each user to determine a threshold value, rating each user's performance based on the threshold value.

20 Claims, 3 Drawing Sheets

DRIVER SIMULATION SYSTEM AND METHODS OF PERFORMING THE SAME

RELATED APPLICATIONS

This application claim priority to U.S. Provisional Patent Application No. 62/180,703 titled "DRIVER SIMULATION SYSTEM AND METHODS OF PERFORMING THE SAME" and filed on Jun. 17, 2015.

BACKGROUND OF THE INVENTION

Simulating conditions encountered during the operation of a vehicle assists operators of vehicles in learning better operating techniques. However, conventional simulation techniques do not allow for accurate rating of one operator in relation to another operator. A need exists for a simulation system that allows users to operate different simulations for comparison against a performance baseline.

SUMMARY OF THE INVENTION

One embodiment of the present disclosure includes a method of simulating manipulating a vehicle, the method including the steps of transmitting a simulation to a plurality of remote devices, gathering information pertaining to a response of each user to the simulation on each remote device, comparing each response of each user to determine a threshold value, rating each user's performance based on the threshold value.

In another embodiment, the method includes the step of gathering information from a user to determine one of plurality of simulations to transmit to the remote devices.

In another embodiment, the information gathered includes an attribute of operating the vehicle to be tested.

In another embodiment, the method includes the step of gathering information pertaining to a response includes gathering values from at least one sensor coupled to the system.

In another embodiment, at least one sensor is a wheel unit, brake unit or pedal unit.

In another embodiment, the method includes the step of dividing the simulation into at least one portion and determining at least one threshold value for each portion.

In another embodiment, the method includes the step of determining a rating for each user for each portion of the simulation.

In another embodiment, the information gathered pertains to a simulation of driving an automobile.

In another embodiment, the simulation includes information to gather during the execution of the simulation.

In another embodiment, the simulation includes a list of commands to execute during the simulation.

Another embodiment of the present disclosure includes a vehicle simulation system, including an information gathering unit gathers information on a desired simulation, selects a simulation based on the information gathered and transmits a simulation to a plurality of remote devices, a simulation tracking unit hat gathers information pertaining to a response of each user to the simulation on each remote device, a driver analysis unit that compares each response of each user to determine a threshold value and determines a rating for each user's performance based on the threshold value.

In another embodiment, the information gathering unit gathers information from a user to determine at least two of a plurality of simulations to transmit to the remote devices.

In another embodiment, the information gathered includes an attribute of operating the vehicle to be tested.

In another embodiment, the simulation tracking unit gathers values from at least one sensor coupled to the system.

In another embodiment, at least one sensor is a wheel unit, brake unit or pedal unit.

In another embodiment, the simulation is divided into at least one portion and the threshold value is determined for each portion.

In another embodiment, a rating is determined for each user for each portion of the simulation.

In another embodiment, the information gathered pertains to a simulation of driving an automobile.

In another embodiment, the simulation includes information to gather during the execution of the simulation.

In another embodiment, the simulation includes a list of commands to execute during the simulation.

BRIEF DESCRIPTION OF THE SEVERAL VIEWS OF THE DRAWING

Details of the present invention, including non-limiting benefits and advantages, will become more readily apparent to those of ordinary skill in the relevant art after reviewing the following detailed description and accompanying drawings, wherein.

DETAILED DESCRIPTION OF THE INVENTION

This disclosure relates to a network based driver simulation system that provides centralized management of a plurality of driving scenarios that are transmitted to local simulation units for execution. The local simulation units are configured to execute the simulations and to gather information related to the user's performance responding to the scenarios presented during the simulation. The information gathered is then used to present new simulations to the user based on the user's performance in view of the performance of other users.

Figure 1:
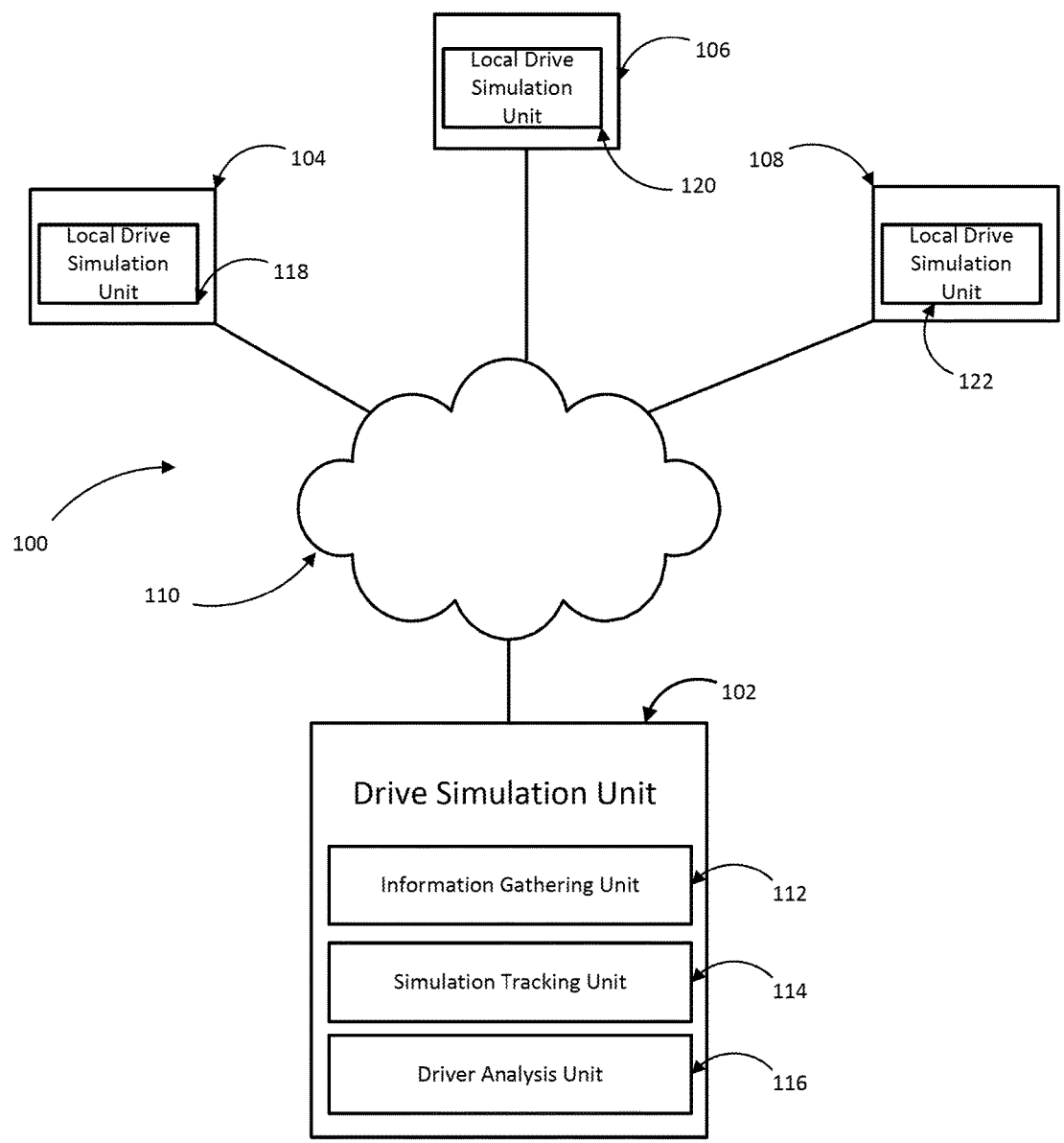
FIG. 1 depicts a block diagram of an Driver Simulation System suitable for use with the methods and systems consistent with the present invention.

FIG. 1 depicts a block diagram of an Driver Simulation System ("DSS") 100 suitable for use with the methods and systems consistent with the present invention. The DSS 100 comprises a plurality of computers 102, 104, 106 and 108 connected via a network 110. The network 110 is of a type that is suitable for connecting the computers for communication, such as a circuit-switched network or a packet switched network. Also, the network 110 may include a number of different networks, such as a local area network, a wide area network such as the Internet, telephone networks including telephone networks with dedicated communication links, connection-less network, and wireless networks. In the illustrative example shown in FIG. 1, the network 110 is the Internet. Each of the computers 102, 104, 106 and 108 shown in FIG. 1 is connected to the network 110 via a suitable communication link, such as a dedicated communication line or a wireless communication link.

In an illustrative example, computer 102 serves as an Drive Simulation Unit ("DSU") that includes an information gathering unit 112, simulation tracking unit 114 and a driver analysis unit 116. The number of computers and the network configuration shown in FIG. 1 are merely an illustrative example. One having skill in the art will appreciate that the DSS 100 may include a different number of computers and networks. For example, computer 102 may include the information gathering unit 112, simulation tracking unit 114 and driver analysis unit 116 may reside on different computers. Each of the computers 104, 106 and 108 includes a local driver simulation unit 118, 120 and 122. The driver simulation units 118, 120 and 122 are configured to present a simulated driving environment to a user.

Figure 2:
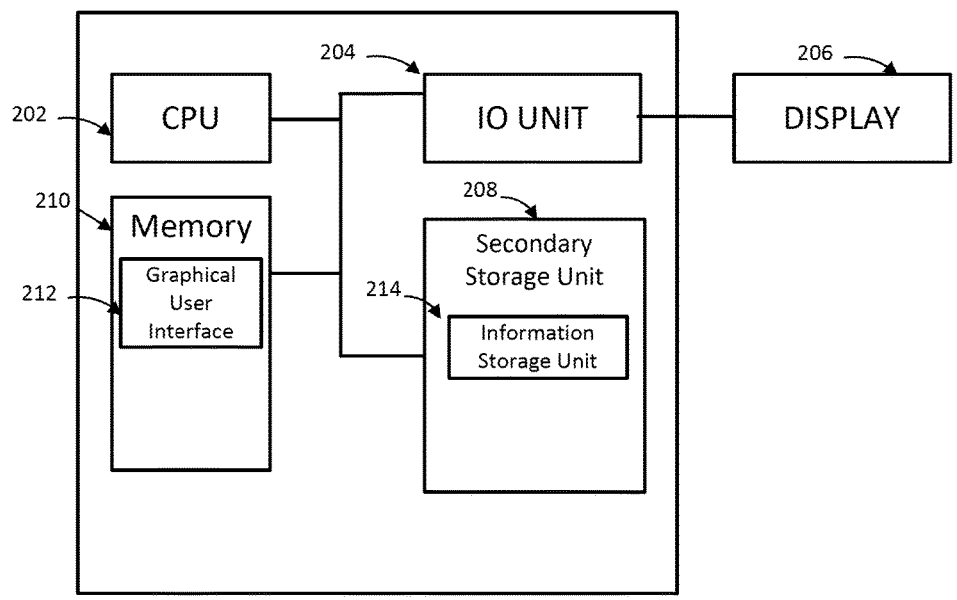
FIG. 2 shows a more detailed depiction of the computer of FIG. 1.

FIG. 2 shows a more detailed depiction of the computer 102. The computer 102 comprises a central processing unit (CPU) 202, an input output (10) unit 204, a display device 206 communicatively coupled to the IO Unit 204, a secondary storage device 208, and a memory 210. The computer 202 may further comprise standard input devices such as a keyboard, a mouse, a digitizer, or a speech processing means (each not illustrated).

The computer 102's memory 210 includes a Graphical User Interface ("GUI") 212 that is used to gather information from a user via the display device 206 and I/O unit 204 as described herein. The GUI 212 includes any user interface capable of being displayed on a display device 206 including, but not limited to, a web page, a display panel in an executable program, or any other interface capable of being displayed on a computer screen. The GUI 212 may also be stored in the secondary storage unit 208. In one embodiment consistent with the present invention, the GUI 212 is displayed using commercially available hypertext markup language ("HTML") viewing software such as, but not limited to, Microsoft Internet Explorer, Google Chrome or any other commercially available HTML viewing software. The secondary storage unit 208 may include an information storage unit 214. The information storage unit may be a rational database such as, but not including Microsoft's SQL, Oracle or any other database.

Figure 3:
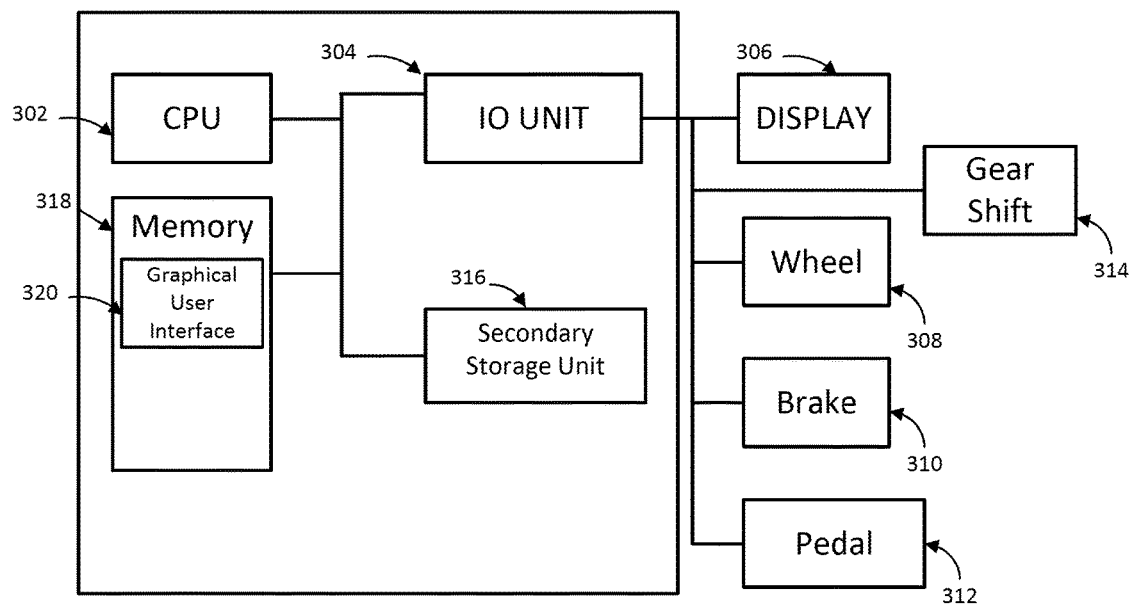
FIG. 3 shows a more detailed depiction of the computers of FIG. 1.

FIG. 3 shows a more detailed depiction of the computers 104, 106 and 108. Each computer 104, 106 and 108 comprises a central processing unit (CPU) 302, an input output (IO) unit 304, a display device 306 communicatively coupled to the IO Unit 304, a wheel unit 308 communicatively coupled to the IO Unit 304, a brake unit 310 communicatively coupled to the IO Unit 304, a pedal unit 312 communicatively coupled to the IO Unit 304, a gear shift unit 314 communicatively coupled to the IO Unit 304, a secondary storage device 316, and a memory 318. The pedal unit 312 includes a brake pedal and accelerator pedal. In one embodiment, the pedal unit 312 includes a clutch pedal. Each computer 104, 106 and 108 may further comprise standard input devices such as a keyboard, a mouse, a digitizer, or a speech processing means (each not illustrated).

Each computer 104, 106 and 108's memory 318 includes a GUI 320 which is used to gather information from a user via the display device 306 and IO unit 304 as described herein. The GUI 320 includes any user interface capable of being displayed on a display device 306 including, but not limited to, a web page, a display panel in an executable program, or any other interface capable of being displayed on a computer screen. The GUI 320 may also be stored in the secondary storage unit 316. In one embodiment consistent with the present invention, the GUI 320 is displayed using commercially available HTML viewing software such as, but not limited to, Microsoft Internet Explorer, Google Chrome or any other commercially available HTML viewing software.

Figure 4:
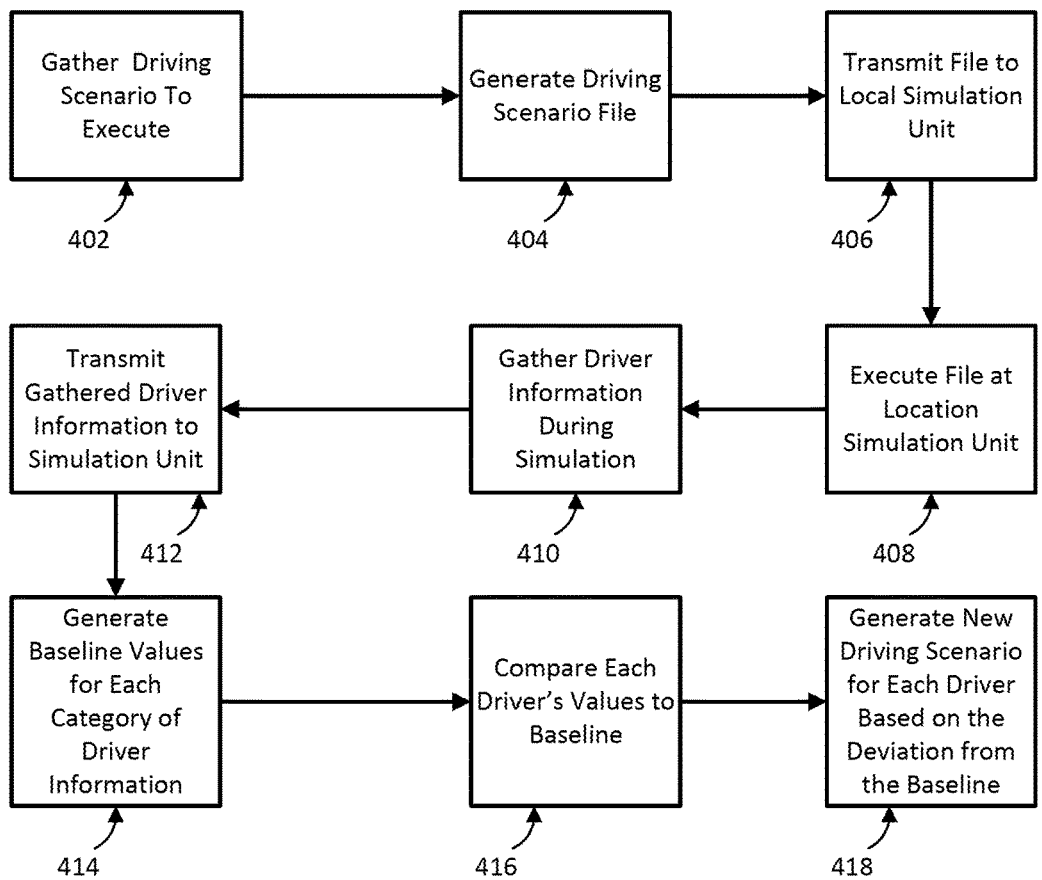
FIG. 4 depicts a schematic representation of a driving simulation system analyzing a driver's performance.

FIG. 4 depicts a schematic representation of a driving simulation system analyzing a driver's performance. In step 402, information related to a driving scenario is gathered by the information gathering unit 112. The information may include the location, or location type, for a simulation, the attributes tested in the simulation, the type of events to occur in the simulation or any other information related to the driving scenario. In step 404, a driving scenario is selected from a plurality of driving scenarios based on the information gathered. Each driving scenario presents a user with a virtual driving environment including a series of obstacles or decisions for the user to react to during the simulation. As an illustrative example, a driving scenario may require a user to take the shortest route from one location to another location, avoid dangerous situations while in route to a location, or react to different simulated events. A plurality of driving scenarios are stored in the DSU 102. In step 406, the information gathering unit 112 transmits the file to at least one local driving simulation unit 118, 120 or 122 via the network 110. In step 408, the local driving simulation unit 118, 120 or 122 receives the files and executes the simulation to a user of the local driving simulation unit 118, 120 or 122.

In step 410, the local driving simulation unit 118, 120 or 122 gathers information relating to the performance of the user of the local driving simulation unit 118, 120 or 122 during the simulation. The performance of the user may include information gathered from the wheel unit 308, brake unit 310, pedal unit 312 and gear shift unit 314. The performance of the user may also include biometric information of the user during the simulation. Each user performance is correlated to a specific portion of the simulation, and logged in the memory 318 of the computer executing the simulation. In step 412, after the simulation has completed, the local driving simulation unit 118, 120 or 122 transmits the information gathered from the user during the simulation to the simulation tracking unit 114 in the drive simulation unit 102.

In step 414, the driver analysis unit 116 analyzes the information gathered from multiple users operating the same or similar simulation. The driver analysis unit 116 determines a baseline value for each type of gathered information from each user during the simulation. As an illustrative example, the driver analysis unit 116 may generate a baseline speed of sixty miles per hour for a portion of a simulation based on the speed of multiple users during that portion of the simulation. The driver analysis unit 116 develops baseline values for each type of gathered information for every portion of the simulation for each user. Types of gathered information may include, but is not limited to, speed, acceleration, braking response time, gear positioning or any other response enacted by the user. In step 416, the driver analysis unit 116 compares the baseline values for the information gathered for each portion of the simulation for each user with the baseline values for that portion to determine if each user deviates from the baseline value. As an illustrative example, the driver analysis unit 116 may determine that a user accelerates to a speed of eighty miles per hour in a portion of the simulation where the baseline is sixty miles an hour. The driver analysis unit 116 may generate an indication that the user deviated from the baseline value during that portion of the simulation. The driver simulation unit 116 compares each user's values to the baseline values for each portion of the simulation and identifies each area where the user deviated from the baseline during the simulation.

In step 418, the simulation tracking unit 114 identifies additional scenarios for each user based on the user's deviations from baseline values. As an illustrative example, the simulation tracking unit 114 may identify a specific scenario related to acceleration for a user that over accelerates in relation to a baseline acceleration during the simulation. In one embodiment, the simulation tracking unit may generate a customized simulation based on the deviations of each user by meshing together portions of other simulations into a single simulation.

Figure 5:
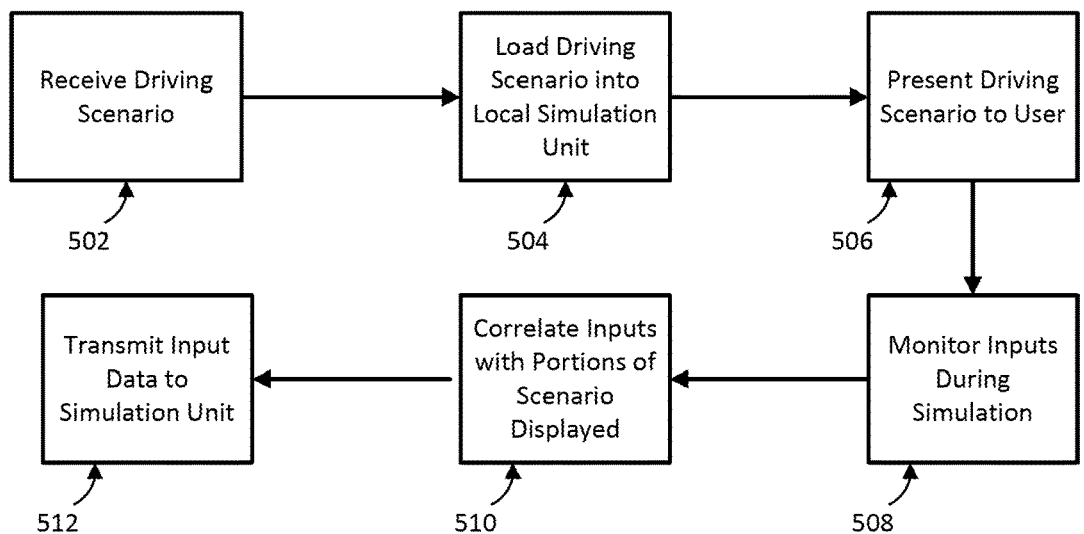
FIG. 5 depicts a schematic representation of a local simulation unit loading and running a simulation.

FIG. 5 depicts a schematic representation of a local simulation unit loading and running a simulation. In step 502, the local simulation unit 118, 120 or 122 receives a simulation from the drive simulation unit 102. The simulation may be a file containing a series of commands the local simulation unit 118, 120 or 122 should execute to perform the simulation. The simulation may also contain instructions on what information to gather form the user during different portions of the simulation or the interval with which information should be gathered from the user during the simulation. In step 504, the local simulation unit 118, 120 or 122 loads the simulation into the operating portion of the local simulation unit 118, 120 or 122. In step 506, the local simulation unit 118, 120 or 122 executes the simulation based on the received simulation. In step 508, the local simulation unit 118, 120 or 122 monitors the user's performance during the simulation. The local simulation unit 118, 120 or 122 may gather information in the form of electrical signals or data from the wheel unit 308, brake unit 310, pedal unit 312 or the gear shift unit 314. The local simulation unit 118, 120 or 122 may also gather biometric information for the user including the pulse and breathing rate, eye movement, level of intoxication, level of perspiration or any other biometric information from the user via a camera or external biometric sensors connected to the IO Unit 304 of the computer 102, 104 or 106.

In step 510, the local simulation unit 118, 120 or 122 correlates the information gathered from the user with a time or distance indicator from the simulation such that the information gathered corresponds to a specific time during the simulation or a specific location presented in the simulation. As an illustrative example, if a user turns a corner at three minutes after the simulation is started, the local simulation unit 118, 120 or 122 logs the acceleration, wheel position, gear shift position and other information and correlates the data to the images displayed to the user during that portion of the simulation. In step 512, the information gathered by the local simulation unit 118, 120 or 122 is transmitted to the drive simulation unit 102.

In the present disclosure, the words "a" or "an" are to be taken to include both the singular and the plural. Conversely, any reference to plural items shall, where appropriate, include the singular.

It should be understood that various changes and modifications to the presently preferred embodiments disclosed herein will be apparent to those skilled in the art. Such changes and modifications can be made without departing from the spirit and scope of the present disclosure and without diminishing its intended advantages. It is therefore intended that such changes and modifications be covered by the appended claims.

The invention claimed is:

1. A method of simulating manipulating a vehicle, the method including the steps of:

transmitting a first simulation to a plurality of remote devices;
gathering information pertaining to a response of each user to the first simulation on each remote device;
comparing each response of each user to determine a threshold value; and
rating each user's performance based on the threshold value; and
generating a second simulation automatically and without human intervention for each user based on each user's deviation from the threshold value.

2. The method of claim 1, including the step of gathering information from a user to determine one of plurality of simulations to transmit to the remote devices.

3. The method of claim 2, wherein the information gathered includes an attribute of operating the vehicle to be tested.

4. The method of claim 1, wherein the step of gathering information pertaining to a response includes gathering values from at least one sensor coupled to the system.

5. The method of claim 4, wherein at least one sensor is a wheel unit, brake unit or pedal unit.

6. The method of claim 1, including the step of dividing the first simulation into at least one portion and determining at least one threshold value for each portion.

7. The method of claim 6, including the step of determining a rating for each user for each portion of the first simulation.

8. The method of claim 1, wherein the first simulation includes information to gather during the execution of the simulation.

9. The method of claim 1, wherein the first simulation includes a list of commands to execute during the first simulation.

10. A vehicle simulation system, including:

an information gathering unit gathers information on a desired simulation, selects a simulation based on the information gathered and transmits a simulation to a plurality of remote devices;
a simulation tracking unit that gathers information pertaining to a response of each user to the simulation on each remote device; and
a driver analysis unit that compares each response of each user to determine a threshold value and determines a rating for each user's performance based on the threshold value;
wherein the simulation tracking unit is configured to generate custom simulations without human intervention for each user based on each user's deviation from the threshold value.

11. The system of claim 10, wherein the information gathering unit gathers information from a user to determine at least two of a plurality of simulations to transmit to the remote devices.

12. The system of claim 11, wherein the information gathered includes an attribute of operating the vehicle to be tested.

13. The system of claim 10 wherein the simulation tracking unit gathers values from at least one sensor coupled to the system.

14. The system of claim 13 wherein at least one sensor is a wheel unit, brake unit or pedal unit.

15. The system of claim 10 wherein the simulation is divided into at least one portion and the threshold value is determined for each portion.

16. The system of claim 15 wherein a rating is determined for each user for each portion of the simulation.

17. The system of claim 10 wherein the information gathered pertains to a simulation of driving an automobile.

18. The system of claim 10 wherein the simulation includes information to gather during the execution of the simulation.

19. The system of claim 10 wherein the simulation includes a list of commands to execute during the simulation.

20. A method of simulating manipulating a vehicle, the method including the steps of:
- transmitting a first simulation to a plurality of remote devices, wherein the first simulation comprises a plurality of portions;
- gathering information pertaining to a response of each of a plurality of users to each of the plurality of portions of the first simulation on each remote device;
- comparing each response of each of the plurality of users to each of the plurality of portions of the first simulation to determine a plurality of threshold values for each of the plurality of portions of the first simulation; and
- rating each user's performance based on the plurality of threshold values; and
- generating a plurality of custom simulations for each of the plurality of users based on each user's deviation from the plurality of threshold values for each of the plurality of portions of the first simulation, wherein the each of the plurality of custom simulations is generated by meshing together at least a subset of the plurality of portions of the first stimulation.

* * * * *